(12) United States Patent
Forrest et al.

(10) Patent No.: US 9,873,939 B2
(45) Date of Patent: Jan. 23, 2018

(54) MICROFLUIDIC DEVICE AND METHOD USING DOUBLE ANODIC BONDING

(75) Inventors: Stephen Forrest, Ann Arbor, MI (US); Gregory McGraw, Ann Arbor, MI (US); Siddharth Harikrishna Mohan, Plainsboro, NJ (US); Diane Peters, Ann Arbor, MI (US)

(73) Assignees: The Regents of the University of Michigan, Ann Arbor, MI (US); Universal Display Corporation, Ewing, NJ (US)

( * ) Notice: Subject to any disclaimer, the term of this patent is extended or adjusted under 35 U.S.C. 154(b) by 1254 days.

(21) Appl. No.: 13/235,981

(22) Filed: Sep. 19, 2011

(65) Prior Publication Data
US 2013/0068165 A1 Mar. 21, 2013

(51) Int. Cl.
| | | |
|---|---|---|
| *B81B 7/00* | (2006.01) | |
| *B81B 1/00* | (2006.01) | |
| *C23C 14/12* | (2006.01) | |
| *C23C 14/22* | (2006.01) | |
| *C23C 14/24* | (2006.01) | |

(52) U.S. Cl.
CPC ............ *C23C 14/12* (2013.01); *C23C 14/228* (2013.01); *C23C 14/243* (2013.01); *Y10T 137/85938* (2015.04)

(58) Field of Classification Search
USPC ................... 347/1, 20, 44, 47; 422/500–508
See application file for complete search history.

(56) References Cited

U.S. PATENT DOCUMENTS

| | | | | |
|---|---|---|---|---|
| 5,619,239 A | * | 4/1997 | Kotaki et al. | 347/86 |
| 7,347,533 B2 | | 3/2008 | Elrod et al. | |
| 7,387,370 B2 | | 6/2008 | Shaarawi et al. | |
| 2007/0019043 A1 | * | 1/2007 | Oya | 347/70 |
| 2010/0013891 A1 | * | 1/2010 | Matsuo | 347/47 |
| 2010/0245479 A1 | | 9/2010 | Forrest et al. | |

(Continued)

FOREIGN PATENT DOCUMENTS

JP 02-024154 1/1990

OTHER PUBLICATIONS

Datta et al., Nanofluidic channels by anodic bonding of amorphous silicon to glass to study ion-accumulation and ion-depletion effect Talanta, vol. 68, Issue 3, Jan. 15, 2006, pp. 659-665.*

(Continued)

*Primary Examiner* — Robert Eom
(74) *Attorney, Agent, or Firm* — Reising Ethington P.C.

(57) ABSTRACT

A microfluidic device for use with a microfluidic delivery system, such as an organic vapor jet printing device, includes a glass layer that is directly bonded to a microfabricated die and a metal plate via a double anodic bond. The double anodic bond is formed by forming a first anodic bond at an interface of the microfabricated die and the glass layer, and forming a second anodic bond at an interface of the metal plate and the glass layer, where the second anodic bond is formed using a voltage that is lower than the voltage used to form the first anodic bond. The second anodic bond is formed with the polarity of the voltage reversed with respect to the glass layer and the formation of the first anodic bond. The metal plate includes attachment features that allow removal of the microfluidic device from a fixture.

17 Claims, 2 Drawing Sheets

(56) References Cited

U.S. PATENT DOCUMENTS

2010/0247766 A1    9/2010   Forrest et al.
2010/0259582 A1   10/2010   Miyakoshi

OTHER PUBLICATIONS

International Search Report for PCT/US2012/055758, dated Mar. 14, 2013, 4 pages.
Written Opinion for PCT/US2012/055758, dated Mar. 14, 2013, 4 pages.

* cited by examiner

MICROFLUIDIC DEVICE AND METHOD USING DOUBLE ANODIC BONDING

TECHNICAL FIELD

The invention relates to anodic bonding and structures and methods of making microfluidic devices such as are used in organic vapor jet printing systems.

BACKGROUND OF THE INVENTION

Various techniques have been developed for depositing and/or patterning organic materials on a substrate for use in constructing organic opto-electronic devices such as organic light emitting diodes (OLEDs), organic phototransistors, organic photovoltaic (PV) cells, or organic photodetectors. These techniques include vacuum thermal evaporation, solution processing, and organic vapor phase deposition, along with printing techniques such as inkjet printing, nozzle printing, thermal vapor jet printing, and organic vapor jet printing (OVJP). Some of these techniques include flowing high temperature fluids and/or high pressure fluids through various components and interfaces between components that may range in size from a macroscopic level, at which bulk materials are typically provided and stored, to a microscopic level, at which the materials may be effectively utilized. One or more seals may be provided at these interfaces to prevent fluid leakage.

Print heads for organic vapor jet printers sometimes require replacement due to wear over time, damage, or some other reason. Such print heads are typically attached and sealed directly to a fixture using an adhesive, where the fixture is the source of high temperature gases used in the printing process. The adhesive may be an epoxy or similar adhesive capable of maintaining bond strength at high temperatures. In order to replace a print head that is adhesively attached, the adhesive bond must be broken. This often requires chiseling or otherwise destructively removing the adhesive and/or print head from the fixture, followed by sand-blasting or other abrasive cleaning of the fixture mounting surface in preparation for another print head attachment.

SUMMARY

According to one aspect of the invention, a microfluidic device is provided for receiving fluids from a fixture. The microfluidic device includes a metal plate having a surface that includes a fluid outlet port and a glass layer having an inlet side and an opposite outlet side. The glass layer is bonded on the inlet side to the surface of the metal plate and has a fluid passage interconnecting the inlet and outlet sides of the glass layer to allow fluid flow therethrough. At least a portion of the glass layer fluid passage is aligned with at least a portion of the fluid outlet port of the metal plate, whereby pressurized fluid exiting the fluid outlet port of the metal plate can enter the fluid passage and can be communicated to the outlet side of the glass layer. The microfluidic device also includes a microfabricated die having an inlet side. The die is bonded on the inlet side to the outlet side of the glass layer and includes a fluid passage to allow fluid flow therethrough. At least a portion of the fluid passage of the die is aligned with at least a portion of the fluid passage of the glass layer, whereby the pressurized fluid communicated to the outlet side of the glass layer can enter the fluid passage of the die. The glass layer is directly bonded to the metal plate via an anodic bond. In some embodiments, the glass layer can also be directly bonded to the die via a second anodic bond such that the microfluidic device includes a double anodic bond.

According to another aspect of the invention, an organic vapor jet printing device is provided and includes a fixture having fluid outlet ports for supplying high temperature gases under pressure and a metal plate fastened to the fixture. The metal plate includes fluid inlet ports, each of which is aligned with one of the fluid outlet ports of the fixture to receive the high temperature gases. The printing device also includes a seal located at an interface of the fixture outlet ports and the plate inlet ports to prevent leakage of the high temperature gases out of the printing device. The printing device additionally includes a silicon-based die bonded to the metal plate and having fluid inlet ports and nozzles that are in fluidic communication with the fluid inlet ports of the die. The metal plate also includes fluid outlet ports that are in fluidic communication with the inlet ports of the metal plate and that are in fluidic communication with the fluid inlet ports of the die so that the high temperature gases can be conducted from the fixture, through the seal, through the metal plate and to the nozzles of the silicon-based die.

In accordance with another aspect of the invention, a method is provided for forming a double anodic bond. The method includes the steps of: (a) stacking a glass plate together with one of: a silicon-based plate and a metal plate, so that planar surfaces of each plate contact each other at an interface; (b) forming an anodic bond at the interface by applying a voltage across the stacked plates; (c) stacking the other one of the silicon-based plate and the metal plate together with the bonded plates so that the glass plate is interposed between the silicon-based plate and the metal plate; and (d) applying a voltage across the stacked metal, glass, and silicon-based plates to form the double anodic bond, wherein the polarity of the voltage is reversed from the voltage applied in step (b) with respect to the plates bonded in step (b).

BRIEF DESCRIPTION OF THE DRAWINGS

Preferred exemplary embodiments of the invention will hereinafter be described in conjunction with the appended drawings, wherein like designations denote like elements, and wherein.

DETAILED DESCRIPTION OF THE ILLUSTRATED EMBODIMENT(S)

The illustrated embodiment is directed to an organic vapor jet printing (OVJP) device as but one example of a microfluidic delivery system that may benefit from the teachings herein. Utilizing the below-described configurations and methods, microfluidic devices may be constructed to be easily replaceable or interchangeable so that, for example, worn devices such as print heads can be easily replaced or so that different fluids from the same fluid supply or source can be mixed in different ways to deliver different mixtures of fluids for microdeposition onto a substrate or other component according to one or more fluid circuits built into the device. This flexibility is made possible in part by the development of a double anodic bonding technique that can provide excellent interfacial seals on opposite sides of a glass or other layer of the device. It is noted that the appended drawings are not necessarily to scale and that any cross-hatching shown is provided for clarity in distinguishing among different components and is not meant to limit the types of materials that may be used with each component.

Figure 1:
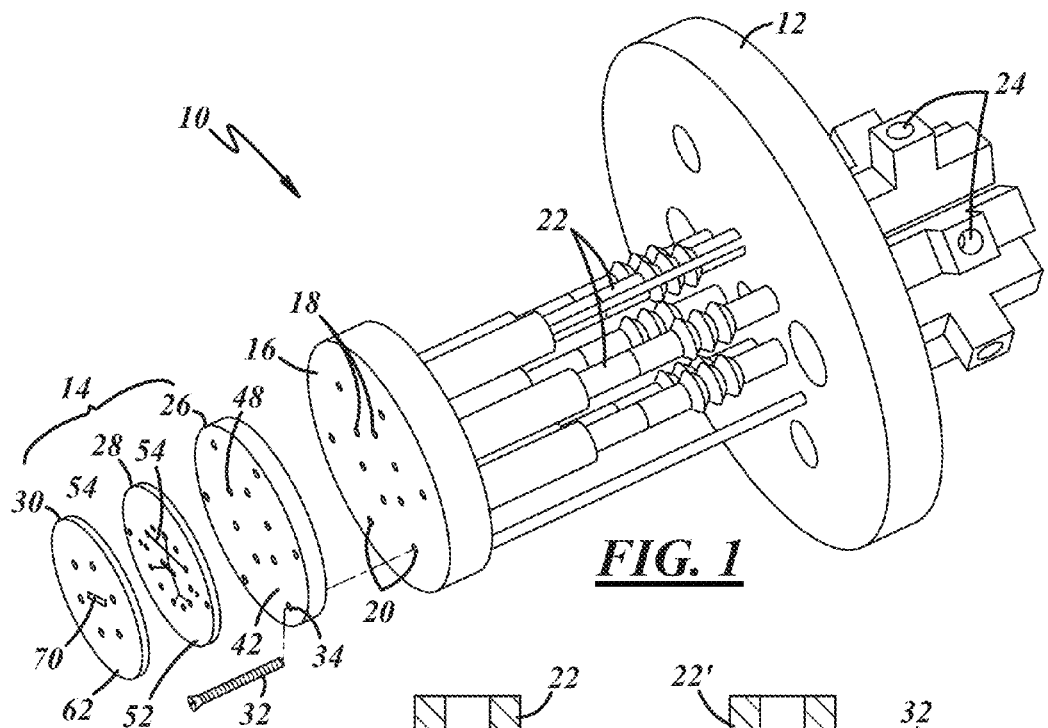
FIG. 1 is a partially exploded view of portions of an organic vapor jet printing (OVJP) assembly, according to one embodiment, showing microfluidic print head components separated from a fixture that can supply high temperature gases to the device.

Referring to FIG. 1, a microfluidic delivery system is shown in the form of an OVJP printing device 10. The illustrated device 10 includes a fixture 12 and a microfluidic device 14 (shown in exploded view) for attachment to the fixture. Microfluidic device 14 is a microfluidic print head in the illustrated embodiment. Fixture 12 may be provided in any number of forms or configurations and may generally be described as any component that provides one or more fluids to microfluidic device 14 when it is attached to the fixture. In the illustrated embodiment, fixture 12 includes a mounting surface 16, having fluid outlet ports 18 and attachment features 20 formed therein, along with various conduits 22 and ports 24 for transporting and delivering high temperature and/or high pressure gases or other fluids to the attached microfluidic device 14. For example, organic materials supplied to the conduits 22, and the conduits 22 may be heated to vaporize the organic materials. The same or different organic materials can be disposed in each individual conduit 22. In one example, a semiconductor host material may be disposed in one conduit and a semiconductor dopant may be disposed in a different conduit. Ports 24 may be used to introduce a carrier gas, such as nitrogen or other gas that does not react with the organic materials, to the printing assembly 10. The carrier gas flows through conduits 22 to mix with the vapor produced therein and to deliver the organic vapor to the print head 14. In the illustrated embodiment, the fixture 12 delivers high temperature gases to print head 14 through outlet ports 18. Fixture 12 may of course include any number of other components not shown or described here. A more detailed description of exemplary OVJP devices, components, and the operation thereof can be found in U.S. Patent Application Publication Nos. 2010/0245479A1 and 2010/0247766A1, the complete contents of which are hereby incorporated by reference.

Print head 14 is a component located at an end of the OVJP assembly 10 that receives one or more fluid(s) from fixture 12 at one end, and delivers the fluid(s) at an opposite end through openings or channels that are generally on a micron scale (e.g., from about 1-500 µm). As shown in the figures, print head 14 may include a metal plate 26, a glass layer 28, and a microfabricated die 30. As will be described, each of these components includes inlet and outlet sides and one or more fluid passages that interconnect the inlet and outlet sides of the component in which they are formed. Each fluid passage is in fluidic communication with one or more ports, and each of the components are in fluidic communication with each other via one or more ports. Certain fluid passages may include one or more nozzles, and some embodiments of fluid passages will be described below. A more detailed description of illustrative print head components, including detailed nozzle configurations, dimensions, and methods of making a print head and its various components may also be found in the U.S. Patent Application Publications incorporated by reference above.

Print head 14 may be attached to fixture 10 so that print head 14 can receive fluid from fixture 12 through outlet ports 18. In the illustrated embodiment, threaded fasteners 32 (only one is shown in FIG. 1) are included to removably fasten the print head 14 to the fixture 12. More specifically, the fasteners 32 pass through attachment features 34 formed in and through the metal plate 26 and further into attachment features 20 formed in the mounting surface 16 of the fixture 12. As used herein, the term "removable" and its derivatives, as used to describe a type of attachment or fastener, indicates that the attachment is intentionally configured so that the attachment can be undone or reversed without causing substantial damage or deformation of the attachment or attached components. Any non-removable attachment may be referred to as a permanent attachment. Other suitable attachment features may be used to removably attach the print head 14 to the fixture 12, such as snap-fit features, press-fit features, clamps, clips, magnets, etc. In this case, attachment features 20, 32 are threaded or unthreaded through-holes or apertures formed in their respective components and aligned to receive fasteners 32. As used herein, any attachment or bond may be a direct attachment, where the attached components physically contact one another, or an indirect attachment, where the attached components may have at least portions of one or more other components situated therebetween. For example, when print head 14 is assembled to the fixture 12, microfabricated die 30 is considered to be attached—more specifically, indirectly attached—to the fixture.

Figure 2:
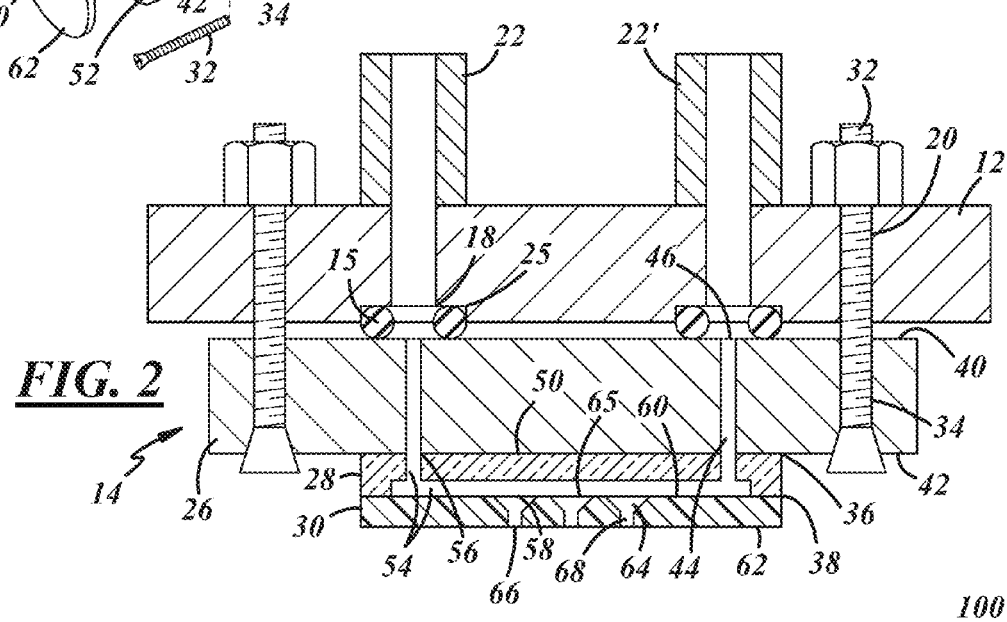
FIG. 2 is a cross-sectional view of an assembled portion of the OVJP assembly of FIG. 1, including a microfluidic print head that is removably fastened to a fixture, according to one embodiment.

Referring now to FIG. 2, the print head 14 is shown removably fastened to the fixture 12. One or more seals, such as O-ring seals 15 may be provided at the interface of the metal plate 26 and mounting surface 16 to prevent leakage of high temperature gases or other fluids from the print head. In this particular example, where separate O-ring seals are located about each of the fluid outlet ports 18 (and the corresponding inlet ports of the metal plate 26), the seals serve not only to prevent fluids from leaking from the print head, but also to prevent fluids from leaking from each individual fluid source or the head-to-fixture/port-to-port interfaces. In this example, the mounting surface 16 further includes sealing features 25 (e.g., the counter-bores shown) formed therein to assist with locating the O-rings 15 during assembly. Sealing features may additionally or alternatively be formed in a corresponding portion of the metal plate 26. In one embodiment, the sealing features may be raised features rather than recessed features, or the plate 26 may have features that fit into or around corresponding features formed on or in the mounting surface 16. In some cases, the sealing feature may double as the seal where a suitable surface finish, material, and/or sealing contact area are available. In embodiments that include compressible O-ring seals 15, fluoroelastomeric materials may be suitable due to their high temperature stability. Perfluoroelastomers are one type of fluoroelastomer that may be suitable for use at the plate-to-fixture interface. Kalrez perfluoroelastomer O-rings available from the DuPont company may be suitable for use as seals 15. Non-organic materials may also be used to fabricate seals 15, preferably a ductile metal such as aluminum or stainless steel, where the surfaces of the seals are of sufficiently high quality to form a fluid-tight seal with the plate 26 and the fixture 12.

Referring now to FIGS. 1 and 2, microfabricated die 30 is shown attached to metal plate 26. In this embodiment, the die 30 is indirectly attached to the metal plate 26 via the glass layer 28 that is interposed between the metal plate 26 and the die 30. In one embodiment, the direct attachment at the interface formed between the metal plate 26 and the glass layer 28 is a permanent bond 36, and the direct attachment at the interface formed between the glass layer 28 and the microfabricated die 30 is a permanent bond 38. Direct, permanent bonds may be formed between adjacent components by anodic bonding, gold diffusion welding, transient liquid phase bonding, the application of certain adhesives, or other suitable techniques that can also form a fluid-tight seal at the bond. In one embodiment, both of bonds 36 and 38 are anodic bonds and together form a double anodic bond that bonds opposite sides of the glass layer 28 to the metal plate 26 and the die 30.

Metal plate 26 is a component to which microfabricated die 30 and/or glass layer 28 may be attached so that the die 30 can be easily removed from the fixture without the necessity of breaking a bond between the fixture 12 and the more fragile glass layer 28 or die 30. In other words, when removable print head 14 is separated from the fixture 12, metal plate 26 stays with the print head. In addition to earlier described elements, metal plate 26 in the illustrated embodiment includes inlet side 40, outlet side 42, and at least one fluid passage 44. Inlet side 40 in this embodiment is the surface of the plate 26 nearest the fixture 12, and outlet side 42 is the surface opposite the inlet side. Fluid passages 44 fluidly interconnect the inlet and outlet sides of plate 26 so that fluid may flow therebetween and through the plate 26. Each fluid passage 44 interconnects a fluid inlet port 46 at the inlet side 40 and a fluid outlet port 48 (FIG. 1) at the outlet side 42. In this instance, each fluid passage 44 is a straight-through passage in an axial direction that is in alignment with the ports 46, 48. As used herein, ports are openings that provide flow access to and from passages formed in a component from a location outside of the component and are defined at the surface of the component in which the passage is formed (i.e., the intersection of the passage and the component surface). In some cases, such as with fluid passages 44, the ports 46, 48 are substantially the same size and are aligned with the remainder of the passage. This may also be the case where an elongated slot is formed completely through a plate or layer of the print head. In other cases a port may provide access to a fluid passage formed in a component, where the fluid passage changes direction within the component.

Metal plate 26 may be constructed from a variety of materials, including iron-nickel-cobalt alloys, titanium, or other metal having a sufficiently low and/or uniform coefficient of thermal expansion. In particular, alloys that are formulated to have thermal expansion coefficients that are compatible with the thermal expansion coefficient of glass layer 28 are preferred. Suitable Fe—Ni—Co alloy for metal plate 26 is available under the trade name Kovar. The metal used to construct the plate 26 may be hot rolled and/or annealed to minimize and internal stress in the plate 26 for more uniform expansion and contraction during use. Metal plate 26 may range in thickness from about 1 mm to about 3 mm or higher. Where anodic bonding is used to join components to a surface of the metal plate 26, the joining surface (in this case, outlet side 42) is preferably prepared for bonding by processing the surface so that the average or RMS surface roughness is about 20 nm or less, where lower surface roughness is better. A combination of abrasive cleaning, progressively finer polishing and pickling may achieve a suitably low surface roughness for bonding.

Glass layer 28 is a layer interposed between the metal plate 26 and the microfabricated die 30 and may serve as a thermal insulator between the plate 26 and die 30. In some embodiments, it may alternatively be known as an insulator layer, a channel layer, or a fluid circuit layer to describe one or more of its possible functions, and skilled artisans may devise constructions that utilize materials other than glass. In the illustrated embodiment, glass layer 28 includes an inlet side 50, an outlet side 52 (FIG. 1), and at least one fluid passage 54. Inlet side 50 in this embodiment is the surface of the layer 28 nearest the fixture 12, and outlet side 52 is the surface opposite the inlet side. Fluid passages 54 fluidly interconnect the inlet and outlet sides of layer 28 so that fluid may flow therebetween and through layer 28. Each fluid passage 54 interconnects a fluid inlet port 56 at the inlet side 50 and at least one fluid outlet port 58 at the outlet side 52. In this instance, the fluid inlet ports 56 of the glass layer 28 are coincident with the fluid outlet ports 48 of the metal layer, as they are the same size, are aligned with one another, and are formed through opposing surfaces in intimate contact. This may not always be the case in all embodiments, however. Also in this example, fluid outlet ports 58 are not defined by the glass layer alone, but by the interface of the inlet ports of die 30 with the open fluid passage 54 of layer 28. Referring to FIG. 2, fluid passage 54 is partially defined by a channel formed along the surface of outlet side 52 of the glass layer. When not assembled with the die 30, passages 54 are not enclosed passages, rather they are open along their length. Passages 54 appear as lines on outlet side 52 of the glass layer 28 in FIG. 1. The ends of each visible portion of passages 54 represent the locations of inlet ports 56.

Referring again to FIGS. 1 and 2, FIG. 1 shows multiple fluid passages 54 formed in the outlet side of the glass layer 28, while FIG. 2 is a cross-section through a single passage 54. The fluid passage 54 shown in FIG. 2 is an example of a mixing chamber, as it connects two fluid inlet ports that are in independent fluidic communication with different fluid sources, represented as the separate conduits 22, 22' in FIG. 2. One or more fluid passages 54 in the glass layer 28 may alternatively split fluid flow from the same conduit 22 of fixture 12 (same inlet port of the glass layer) so that it feeds two or more separate inlet ports of the die 30. One or more fluid passages may also neither combine nor divide fluid flowing therethrough. Thus, a variety of fluid passage 54 configurations may be used in the glass layer 28 to distribute and/or mix incoming fluids or allow incoming fluids to pass directly to the outlet side 58 as desired. A plurality of separate fluid passages 54 may at least partly define fluid circuits that determine how the incoming fluids will be processed prior to exiting the print head 14. In one embodiment, a plurality of separate fluid passages 54 may be configured so that a host material is mixed with a different dopant in each of the separate passages. This may be useful for construction of a multi-color OLED print head in which individual dopants selected for their effect on the color of light emitted by the resulting OLEDs are individually mixed with the same host material, or with different host materials, within the print head. In another example, one removable print head may include a fluid circuit that mixes an organic semiconductor host material with one type of dopant to pattern or print an OLED that emits a particular color of light. That particular print head may be removed and replaced with a different print head that includes a fluid circuit that mixes the same host material with a different type of dopant to pattern or print an OLED that emits a different color of light by fluidly connecting a different inlet port of the glass layer with the inlet port through which the host material flows. It is also possible for similar mixing chambers or flow splitters to be formed in the inlet surface of the die 30 or for complimentary features to be formed in both the inlet surface of the die 30 and the outlet side 52 of the glass layer 28. Glass layer 28 may be constructed from borosilicate glass such as Pyrex or from other types of thermally insulating glass materials to help isolate the heated fixture from the die 30. The glass preferably includes an ionic alkali metal oxide compound in solid solution to facilitate anodic bonding where desired. In one embodiment, the glass layer 28 is about 500 μm thick, and the channels formed in the surface of the glass layer may be about 100-200 μm deep. Of course, these values are non-limiting and disclosed only for purposes of describing one particular embodiment and demonstration of the general size scale of microfluidic devices.

Microfabricated die 30 is a component that receives fluid and ultimately deposits or otherwise disperses the fluid onto or toward a substrate or other component. The term "microfabricated" refers to the dimensional scale on which some of the features of the die are formed. Certain features of die 30 may range in dimension from about 1 μm to about 500 λm, with certain flow passage features having dimensions generally in the 10 to 100 μm range. As with the other layers of print head 14, microfabricated die 30 includes an inlet side 60, an outlet side 62 and at least one flow passage 64 that fluidly interconnects the inlet and outlet sides of the die 30. More specifically, flow passages 64 fluidly interconnect inlet ports 65 (coincident with outlet ports 58 in the glass layer 28) and outlet ports 66. Each of the flow passages 64 may comprise a nozzle 68 having a reduced cross-section compared to its corresponding inlet port 58. As already noted, some of the possible nozzle configurations and methods of making a microfabricated die including one or more nozzles are disclosed in finer detail in the U.S. Patent Application Publications earlier incorporated by reference. A plurality of nozzles may be grouped together in a pattern across the die 30 to define a nozzle array. Each of the nozzles may receive the same or different mixture of vaporized organic materials, or some of the nozzles may receive the same first mixture of materials and others may received the same second mixture of materials, all depending on the configuration of the fluid circuit. In one embodiment, the die 30 may be constructed from silicon or a silicon-based material (a material having silicon as its main constituent) and can be referred to as a silicon-based plate. Metal or ceramic materials may used as well, where suitable processing techniques are available to accomplish microfabrication.

An organic vapor jet print head 14 or other microfluidic device constructed as described above can allow for print head replacement without the need for physically breaking or damaging any of the components, including the attachment itself, during replacement. It also reduces or eliminates the need to recondition the mounting surface of the fixture to which the print head is attached before attaching a different one. The above-described print head constructions may offer the additional advantage of easy interchangeability so that the print head can be removed and interchanged with another print head before it has reached the end of its useful life, then reinstalled for further use at a later time. For example, print heads having different print line spacing, different nozzles shapes, different nozzle array patterns, and/or different fluid circuits that mix the same source materials differently may be easily interchanged with one another. Additionally, the absence of organic adhesive materials at the various interfaces between components may be advantageous, as these types of materials can outgas or vaporize at high temperatures and potentially contaminate the fluids flowing through the print head.

Figures 3, 4:
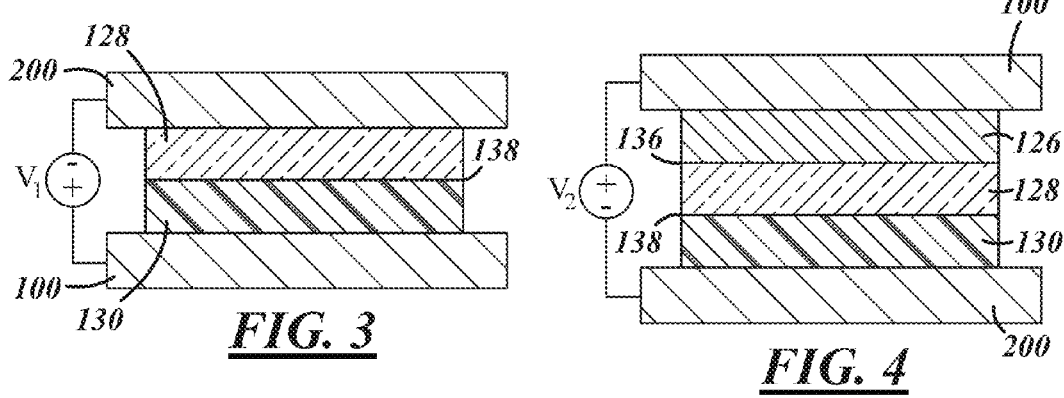
FIG. 3 is a cross-sectional view of a glass plate and a silicon-based plate undergoing an anodic bonded process, according to one embodiment.
FIG. 4 is a cross-sectional view of the plates of FIG. 3 undergoing a double anodic bonding process, according to one embodiment.

With reference to FIGS. 3 and 4, an illustrative method of forming a double anodic bond will now be described, and this method may be used to construct the embodiment of FIGS. 1 and 2 or to construct one or more other embodiments of microfluidic or other devices. According to one embodiment, the method generally includes at least the step of applying a voltage across a plate stack using positive and negative electrodes, wherein the negative electrode is in contact with a silicon-based plate of the plate stack. This method step runs counter to typical anodic bonding processes for silicon wafers, in which the positive electrode from the voltage source is normally placed in contact with the silicon wafer, not the negative electrode. In the particular embodiment described below, the method includes providing a plate stack of three plates such as in FIGS. 1 and 2, including a metal plate 126, glass plate 128, and silicon-based plate 130. Two of plates, such as the glass plate 128 and silicon-based plate 130 can be bonded together via an anodic bond formed in a suitable manner using voltage applied across the plate stack, with the third plate then being stacked on the remaining exposed side of the glass plate. A second anodic bond is then formed, this one between the third plate (e.g., metal plate 126) and the glass plate 128, by applying a voltage having a polarity that is the reverse of that used to form the first anodic bond. This method step may be part of a process having additional steps performed before and/or after applying the negative side of an electrical potential to the silicon-based plate of the plate stack.

More particularly, as shown in FIG. 3, a glass plate 128 may be stacked together with a silicon-based plate 130 as shown so that surfaces of each plate oppose each other at an interface 138. A voltage $V_1$ may be applied across the stacked plates with a positive electrode (or cathode) 100 in contact with the silicon-based plate 130 and a negative electrode (or anode) 200 in contact with the glass plate 128. The applied voltage may be at or around 1000V or between about 800V and about 1200V. The higher the voltage, the faster an anodic bond will form at the interface. Other typical anodic bonding process parameters may be controlled as well, such as the temperature, chamber pressure, and the pressure or clamp force applied to opposite sides of the stacked plates. A sufficiently strong anodic bond at interface 138 may be formed in about 5-10 minutes at a voltage of about 1000 V.

As shown in FIG. 4, metal plate 126 may then be stacked together with the anodically bonded glass and silicon-based plates 128, 130 so that a surface of the metal plate 126 opposes the exposed surface of the glass plate 128 at an interface 136. As described above, the surface of the metal plate 126 to be bonded with the glass plate 128 may be prepared for bonding by ensuring that the surface roughness of the metal plate bonding surface is sufficiently low. In addition, though typical anodic bonding processes do not require the surface of the glass plate 128 to be prepared, some surface preparation may be necessary for the exposed surface of the glass plate 128 after the anodic bond with the silicon-based plate is formed. Due to ionic transport within the glass plate 128 during the anodic boding process, a surface layer or a precipitate of an alkaline oxide, such as NaO, may be present at the exposed side of the glass plate 128. In one embodiment, an RCA cleaning process may be used to clean the exposed surface of the glass plate prior to placing the metal plate 126 thereon. Of course, other cleaning processes may be used.

Figure 5:
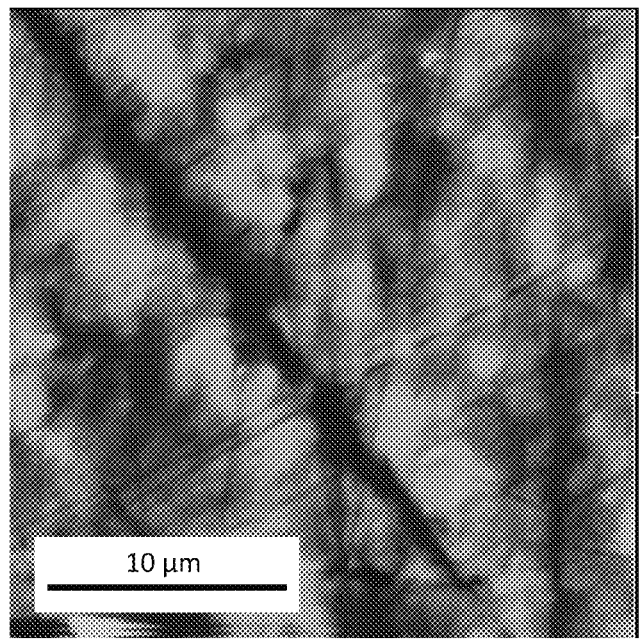
FIG. 5 is an atomic force micrograph of a bonding surface of a metal plate after preparation for anodic bonding.
Figure 6:
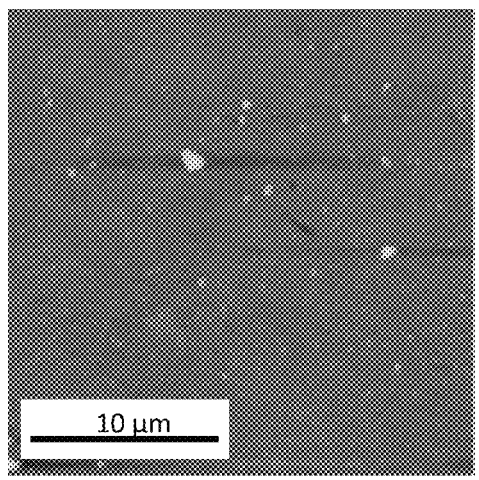
FIG. 6 is an atomic force micrograph of a surface of a glass plate after an opposite surface of the glass plate has been anodically bonded to a silicon-based plate.
Figure 7:
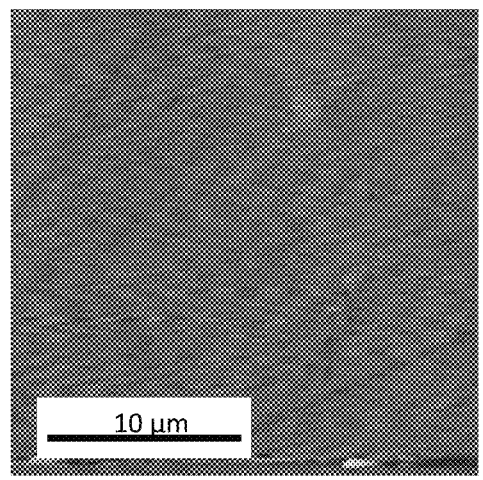
FIG. 7 is an atomic force micrograph of the surface of the glass plate of FIG. 6 shown after an RCA cleaning process.

FIGS. 5-7 illustrate exemplary metal plate 126 and glass plate 128 surfaces that may be suitable for use in anodic bonding. FIG. 5 is an atomic force micrograph (AFM) of one surface of a metal plate that has been prepared for anodic bonding. The particular metal plate surface shown in FIG. 5 was prepared by a process including the steps of annealing, grinding, lapping, polishing, and acid pickling to achieve an RMS surface roughness of about 14 nm. FIG. 6 is an AFM of the exposed surface of a glass plate after the opposite surface has been anodically bonded to a silicon-based plate. The RMS surface roughness of the illustrated surface is about 3.0-3.5 nm, and the light spots shown along the surface are believed to be NaO precipitates. FIG. 7 is an AFM of the exposed surface of the glass plate of FIG. 7 after an RCA cleaning procedure. The RMS surface roughness of the illustrated surface is about 3.0-3.5 nm, or about the same as the roughness prior to the RCA cleaning, but the precipitates have been removed.

Referring again to FIG. 4, the plate stack including the bonded glass and silicon-based plates 128, 130 and the metal plate 126 is placed between electrodes 100 and 200 again, and a voltage $V_2$ is applied across the stack to form an anodic bond at the interface 136, thereby completing the formation of the double anodic bond. However, in this second anodic bonding step, the polarity of the voltage is reversed; i.e., the electrode that is in contact with the silicon based plate 130 becomes the anode and the opposite electrode becomes the cathode. Because the anodic bonding process relies on bringing negative oxygen ions to the bonding surface to covalently bond the glass surface to the opposite surface, the positive electrode must be positioned to attract the negative ions toward the metal plate 126. A typical anodic bonding process does not expose a silicon-glass interface to current flow in this opposite direction.

In addition to the polarity of the voltage being reversed to form the second anodic bond, $V_2$ may be lower than $V_1$ as well, in order to avoid dielectric breakdown of the silicon-based material and/or the partial or complete elimination of the anodic bond at interface 138. In one embodiment, the voltage applied across the plate stack in the second anodic bonding step may be no greater than about 800 V, and the initially applied voltage $V_2$ may be even lower, such as about 500 V or less. The time required to form the second bond of the double anodic bond may thus be greater than the time required to form the first anodic bond. The time to form the second anodic bond may range from about 30 to about 60 minutes, for example, at an applied voltage of about 700-800V.

In another embodiment, $V_2$ is applied as a variable voltage. For example, the initial value of $V_2$ may be in a range from about 400 V to about 600 V, and the final value may range from about 800 V to about 1000 V. The rate of voltage increase during the formation of the second anodic bond may range from about 10 to about 20 V/min so that from a starting $V_2$ of 500V, about 25-50 minutes is required to reach 1000 V. $V_2$ may be continuously increased, or it may be increased in discrete steps. This gradual application of $V_2$ to form the second anodic bond is thought to allow time for the uneven distribution of ions in the glass plate, due to the first anodic bonding step, to at least partially equalize. The voltage and time combinations are non-limiting and may vary depending on the particular materials and the size of the components being bonded. For example, the above ranges may be applicable for plates or layers having a diameter or average width across their bond surfaces that ranges from about 15 mm to about 25 mm. Some embodiments include bonding plates having diameters or average widths ranging from about 50-100 mm, or about 75-80 mm in one particular implementation. The time required to form sufficient bonds with plates having larger dimensions may be greater due to the increased surface area of the bond surfaces and the associated increase in the number of individual atomic bonds to be formed.

Forming a double anodic bond at opposite sides of a glass plate, such as glass layer 38 described in the microfluidic device embodiments presented above, allows for superior seals at the interfaces between the various layers of the device. Anodic bonds can withstand the high operation temperatures associated with OVJP, typically around 300° C., with little to no effect on bond strength. Additionally, anodic bonding may offer advantages over polymer or other organic-based sealant/adhesive materials. Most organic materials will begin to breakdown or degrade at such high operating temperatures. Even polymeric materials that are rated for use at high temperatures and that may generally maintain chemical stability at high temperatures may tend to outgas—i.e., low molecular weight substances, additives, or residual unreacted monomer may be forced out of the material. In an OVJP application, this may be exceptionally detrimental because the outgassed organics may mix with the vapors that are intended to be deposited on a substrate, thereby contaminating the desired organic materials and decreasing performance of the resulting opto-electronic devices.

It is to be understood that the foregoing description is of one or more embodiments of the invention. The invention is not limited to the particular embodiment(s) disclosed herein, but rather is defined solely by the claims below. Furthermore, the statements contained in the foregoing description relate to the disclosed embodiment(s) and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art.

As used in this specification and claims, the terms "e.g.," "for example," "for instance," "such as," and "like," and the verbs "comprising," "having," "including," and their other verb forms, when used in conjunction with a listing of one or more components or other items, are each to be construed as open-ended, meaning that that the listing is not to be considered as excluding other, additional components or items. Other terms are to be construed using their broadest reasonable meaning unless they are used in a context that requires a different interpretation.

The invention claimed is:

1. A microfluidic device for receiving fluids from a fixture, comprising:
a metal plate having a fluid inlet port and a surface that includes a fluid outlet port, the metal plate further comprising an attachment feature configured for removable attachment of the microfluidic device to the fixture via a corresponding attachment feature of the fixture and arranged so that the inlet port of the metal plate aliens with an outlet port of the fixture when the attachment features are engaged to removably attach the microfluidic device to the fixture;

a glass layer having an inlet side and an opposite outlet side and being bonded on the inlet side to the surface of the metal plate, the glass layer having a fluid passage interconnecting the inlet and outlet sides of the glass layer to allow fluid flow through the glass layer, at least a portion of the fluid passage being aligned with at least a portion of the fluid outlet port of the metal plate, whereby pressurized fluid exiting the fluid outlet port of the metal plate enters the fluid passage and is communicated to the outlet side of the glass layer; and a microfabricated die having an inlet side and being bonded on the inlet side to the outlet side of the glass layer, the die having a fluid passage to allow fluid flow through the die, at least a portion of the fluid passage of the die being aligned with at least a portion of the fluid passage of the glass layer, whereby the pressurized fluid communicated to the outlet side of the glass layer enters the fluid passage of the die;

wherein the glass layer is directly bonded to the metal plate via an anodic bond.

2. The microfluidic device set forth in claim 1, further comprising:

a fluid passage interconnecting the inlet and outlet ports of the metal plate; and a sealing surface formed in the metal plate about the fluid inlet port of the metal plate, the sealing surface being configured to accommodate a separately provided seal in a manner that prevents leakage of high temperature gases when the microfluidic device is removably attached to the fixture.

3. The microfluidic device set forth in claim 2, wherein the sealing surface is configured to accommodate an O-ring.

4. The microfluidic device set forth in claim 1, further comprising a mixing chamber formed at least in part by one of said fluid passages, the mixing chamber being in fluidic communication with at least two different fluid inlet ports of the metal plate.

5. The microfluidic device set forth in claim 1, wherein the metal plate includes an additional outlet port aligned with a different portion of the fluid passage of the glass layer so that the fluid passage of the glass layer interconnects both of the outlet ports of the metal plate and conducts fluid received from the outlet ports of the metal plate to the outlet side of the glass layer.

6. The microfluidic device set forth in claim 1, wherein the glass layer further comprises:

a plurality of separate fluid passages interconnecting the inlet side and the outlet side of the glass layer, wherein each of the separate fluid passages interconnects a fluid inlet port at the inlet side of the glass layer and a fluid outlet port at the outlet side of the glass layer;

wherein at least one of the separate fluid passages is in fluidic communication with an additional fluid inlet port at the inlet side of the glass layer or an additional fluid outlet port at the outlet side of the glass layer.

7. The microfluidic device set forth in claim 1, wherein the microfabricated die further comprises an outlet side, and the fluid passage of the microfabricated die further comprises:

a fluid inlet port at the inlet side of the die;
a fluid outlet port at the outlet side of the die; and
a nozzle located between and in fluidic communication with the fluid inlet port and the fluid outlet port of the die.

8. The microfluidic device set forth in claim 1, wherein the microfabricated die further comprises an outlet side, and the device further comprises:

a plurality of outlet ports formed in the metal plate; and
a plurality of nozzles formed in the microfabricated die such that each nozzle provides a spray of fluid via an associated outlet port at the outlet side of the die, wherein each one of the nozzles fluidly connects its associated outlet port with at least one of the outlet ports of the metal plate via the glass layer.

9. The microfluidic device set forth in claim 8, wherein at least one of the nozzles is fluidly connected to a different one of the outlet ports of the metal plate than another one of the nozzles.

10. The microfluidic device set forth in claim 1, wherein the glass layer is directly bonded to the die via an anodic bond, whereby the microfluidic device includes a double anodic bond.

11. The microfluidic device set forth in claim 1, wherein the metal plate is fabricated from a metal having a thermal expansion coefficient that is equal to or less than the thermal expansion coefficient of titanium.

12. An organic vapor jet printing device, comprising:

the microfluidic device of claim 1 removably attached to the fixture; and a seal located at an interface of the fixture outlet ports and plate inlet ports to prevent leakage of high temperature gases from the printing device.

13. A microfluidic device for receiving fluids from a fixture, comprising:

a plate configured for attachment to the fixture and having a fluid inlet port configured to receive fluid when attached to the fixture;

a microfabricated die having a fluid outlet port in fluidic communication with the fluid inlet port of the plate and being configured to discharge the received fluid from the fluid outlet port toward a substrate; and a channel layer interposed between the plate and the die and having a fluid passage in fluidic communication with the fluid inlet port and the fluid outlet port, wherein the channel layer is directly attached to the plate and the die via a double anodic bond, each of the plate, die, and channel layer being fabricated from different types of materials.

14. The microfluidic device set forth in claim 13, wherein the plate is configured for removable attachment to the fixture.

15. The microfluidic device set forth in claim 13, wherein the plate is metal, the die is silicon, and the channel layer is glass.

16. The microfluidic device set forth in claim 13, wherein each of the plate, die, and channel layer are fabricated from a material capable of exposure to pressurized and vaporized organic material received from the fixture.

17. An organic vapor jet printing device, comprising:

the microfluidic device of claim 13 removably attached to the fixture; and a seal located at an interface of the fixture and the plate to prevent leakage of high temperature gases from the printing device.

* * * * *